(12) United States Patent
Tanaka et al.

(10) Patent No.: US 7,346,414 B2
(45) Date of Patent: Mar. 18, 2008

(54) MOVING MECHANISM AND STAGE SYSTEM IN EXPOSURE APPARATUS

(75) Inventors: Hideo Tanaka, Utsunomiya (JP);
Kazunori Iwamoto, Utsunomiya (JP);
Yukio Takabayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 260 days.

(21) Appl. No.: 11/210,786

(22) Filed: Aug. 25, 2005

(65) Prior Publication Data
US 2005/0280799 A1    Dec. 22, 2005

Related U.S. Application Data

(62) Division of application No. 10/212,748, filed on Aug. 7, 2002, now Pat. No. 6,990,386.

(30) Foreign Application Priority Data
Aug. 9, 2001    (JP)    ............................. 2001-241814

(51) Int. Cl.
*G06F 19/00* (2006.01)
(52) U.S. Cl. .................. 700/113; 700/121; 700/228
(58) Field of Classification Search ................ 700/113, 700/121, 102, 228; 702/200; 355/50, 53, 355/2, 757
See application file for complete search history.

(56) References Cited

U.S. PATENT DOCUMENTS

| | | | |
|---|---|---|---|
| 4,976,415 A | 12/1990 | Murai et al. | ................. 267/136 |
| 5,187,519 A | 2/1993 | Takabayashi et al. | ......... 355/53 |
| 5,372,471 A | 12/1994 | Wu | ........................... 414/786 |
| 5,467,720 A | 11/1995 | Korenaga et al. | ............. 108/20 |
| 5,544,451 A | 8/1996 | Cheng et al. | ............... 52/167.2 |
| 5,684,856 A | 11/1997 | Itoh et al. | ...................... 378/34 |
| 5,909,272 A | 6/1999 | Osanai et al. | .................. 355/53 |
| 5,933,215 A | 8/1999 | Inoue et al. | ................... 355/53 |
| 6,170,622 B1 | 1/2001 | Wakui et al. | ............... 188/378 |
| 6,266,133 B1 | 7/2001 | Miyajima et al. | ............. 355/72 |
| 6,322,060 B1 | 11/2001 | Mayama et al. | ............ 267/136 |
| 6,657,703 B2 | 12/2003 | Kurosawa | ..................... 355/55 |
| 6,717,653 B2 | 4/2004 | Iwamoto et al. | .............. 355/72 |
| 2003/0040831 A1 | 2/2003 | Tanaka et al. | .............. 700/121 |

*Primary Examiner*—Leo Picard
*Assistant Examiner*—Sheela Rao
(74) *Attorney, Agent, or Firm*—Fitzpatrick, Cella, Harper & Scinto

(57) ABSTRACT

A moving mechanism includes a first structural member having a first guide surface, a moving member being movable along the first guide surface, a second structural member having a second guide surface, and an actuator having a movable element provided on the moving member and a stator which is movable along the second guide surface. The first structural member is supported by the second structural member at three positions.

10 Claims, 7 Drawing Sheets

URL  http://www.maintain.co.jp./db/input.html

TROUBLE DB INPUT WINDOW

DATE  2000/3/15  ~404
MACHINE  * * * * * * * * *  ~401
FILE  OPE. FAILURE (STARTING ERROR)  ~403
S.N. S/N  465NS4580001  ~402
EMERGENCY  D  ~405
STATE  LED FLICKERING AFTER POWERED  ~406
SOLUTION  RESTART:PRESS RED BUTTON  ~407
PROGRESS  TEMPORARY SOLUTION DONE  ~408

[NEXT] [RESET]  ~410      ~411      ~412
LINK TO RESULT           SOFTWARE    OPERATION
LIST DATABASE            LIBRARY     GUIDE

FIG. 5

MOVING MECHANISM AND STAGE SYSTEM IN EXPOSURE APPARATUS

This application is a divisional application of U.S. patent application Ser. No. 10/212,748, filed Aug. 7, 2002 now U.S. Pat. No. 6,990,386.

FIELD OF THE INVENTION AND RELATED ART

This invention relates to a moving mechanism and, more particularly, to a moving mechanism suitably usable in a high-precision processing operation. For example, the present invention is suitably applicable to a stage system used in an exposure apparatus for the manufacture of semiconductor devices, or the like.

Exposure apparatuses for the manufacture of semiconductor devices, for example, have a stage system (wafer stage or reticle stage) for moving a wafer (substrate) or a reticle (original) at a high speed and then for positioning the same. When a stage, which constitutes a moving member, is driven, there occurs a reaction force of an inertia force due to the acceleration/deceleration. If it is transmitted to a structure which guides the motion of the moving member, it may cause vibration or swinging motion of the structure. On that occasion, natural vibration of the mechanism system of the exposure apparatus may be excited to produce high-frequency vibration, deteriorating high-speed and high-precision positioning.

Some proposals have been made to solve the problem related to the reaction force. An example is a system in which a stator of a linear motor for driving a stage is supported at the same guide surface as that of the stage. The reaction force is managed by displacement of the stator due to the reaction force in the driving operation, by which swinging motion of the structure is prevented. In such a conventional example, however, a displacement load of the stator may cause deformation of the whole stage structure, which may be adversely influential to the stage positioning precision.

In order to manage the reaction force of the moving member, being driven, by use of a small displacement of the stator, the stator and the moving member must have a large mass ratio such as 10:1, for example. Further, for a structural reason, the stator must be disposed outside the guide surface. For these reasons, a displacement of the stator, even if it is very short, may cause large deformation of the guide surface, which may lead to an error in the positioning precision for the moving member.

SUMMARY OF THE INVENTION

It is an object of the present invention to prevent deformation of a guide surface for a moving member, which might otherwise be produced in reaction force management.

It is another object of the present invention to avoid an adverse influence, to a floor, of a reaction force due to acceleration/deceleration of a stage or of a change in load, thereby to reduce and adverse influence to another apparatus disposed on the same floor.

In accordance with an aspect of the present invention, there is provided a moving mechanism, comprising: a first structural member having a first guide surface; a moving member being movable along said first guide surface; a second structural member having a second guide surface; and an actuator having a movable element provided on said moving member and a stator being movable along said second guide surface, wherein said first and second structural members are isolated from each other with respect to vibration.

The stator may preferably be displaceable along the second guide surface, due to a reaction force produced when the moving member is driven.

The first structural member may be mounted on the second structural member with an anti-vibration table interposed therebetween.

The moving mechanism, as a whole, may be mounted on an anti-vibration table.

The moving mechanism may further comprise stator-position driving control means effective to hold a relative position between the stator and the second guide surface.

The actuator may be a linear motor having the moving element and the stator.

In accordance with another aspect of the present invention, there is provided a stage system, comprising: a first structural member having a first guide surface, a moving member being movable along said first guide surface, and an actuator having a movable element provided on said moving member and a stator being movable along said second guide surface, wherein said first and second structural members are isolated from each other with respect to vibration, and wherein said moving member moves while carrying an article thereon.

In accordance with a further aspect of the present invention, there is provided an exposure apparatus, comprising: a first structural member having a first guide surface, a moving member being movable along said first guide surface, a second structural member having a second guide surface, and an actuator having a movable element provided on said moving member and a stator being movable along said second guide surface, wherein said first and second structural members are isolated from each other with respect to vibration, and wherein said moving member carries thereon at least one of an original having a pattern and a substrate to which the pattern is to be transferred, so that the pattern of the original can be projected onto the substrate through a projection optical system.

In accordance with a yet further aspect of the present invention, there is provided a device manufacturing method, comprising the steps of: providing a group of production machines for performing various processes, including an exposure apparatus as discussed above, in a semiconductor manufacturing factory, and producing a semiconductor device through plural processes using the production machine group.

The method may further comprise (i) connecting the production machines of the group with each other through a local area network, and (ii) executing data-communication concerning information related to at least one production machine of the production machine group, between the local area network and an external network outside the semiconductor manufacturing factory.

In the method, there may be a database provided by a vendor or a user of the exposure apparatus which can be accessed through the external network so that maintenance information related to the production machine can be obtained through the data communication, wherein production control can be performed on the basis of data communication made through the external network and between the semiconductor factory and a separate semiconductor factory.

In accordance with a still further aspect of the present invention, there is provided a semiconductor manufacturing factory, comprising: a group of production machines for performing various processes, including an exposure apparatus as discussed above, a local area network for connecting the production machines of the production machine group with each other, and a gateway for enabling an access from the local area network to an external network outside the factory, such that information related to at least one production machine in the group can be data communicated.

In accordance with a yet further aspect of the present invention, there is provided a method of executing maintenance for an exposure apparatus as discussed above and being provided in a semiconductor manufacturing factory, said method comprising the steps of: preparing, by a vendor or a user of the exposure apparatus, a maintenance database connected to an external network outside the semiconductor manufacturing factory, admitting an access from the semiconductor manufacturing factory to the maintenance database through the external network, and transmitting maintenance information stored in the maintenance database to the semiconductor manufacturing factory through the external network.

The exposure apparatus may further comprise a display, a network interface and a computer for executing network software, wherein maintenance information related to the exposure apparatus is data communicated through the computer network.

The network software may provide on the display a user interface for accessing a maintenance database prepared by a vendor or a user of the exposure apparatus and connected to an external network outside a factory where the exposure apparatus is placed, thereby to enable obtaining information from the database through the external network.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a schematic view for explaining an example of a user interface.

DESCRIPTION OF THE PREFERRED EMBODIMENTS

Preferred embodiments of the present invention will now be described with reference to the attached drawings.

[First Embodiment]

Figure 1A:
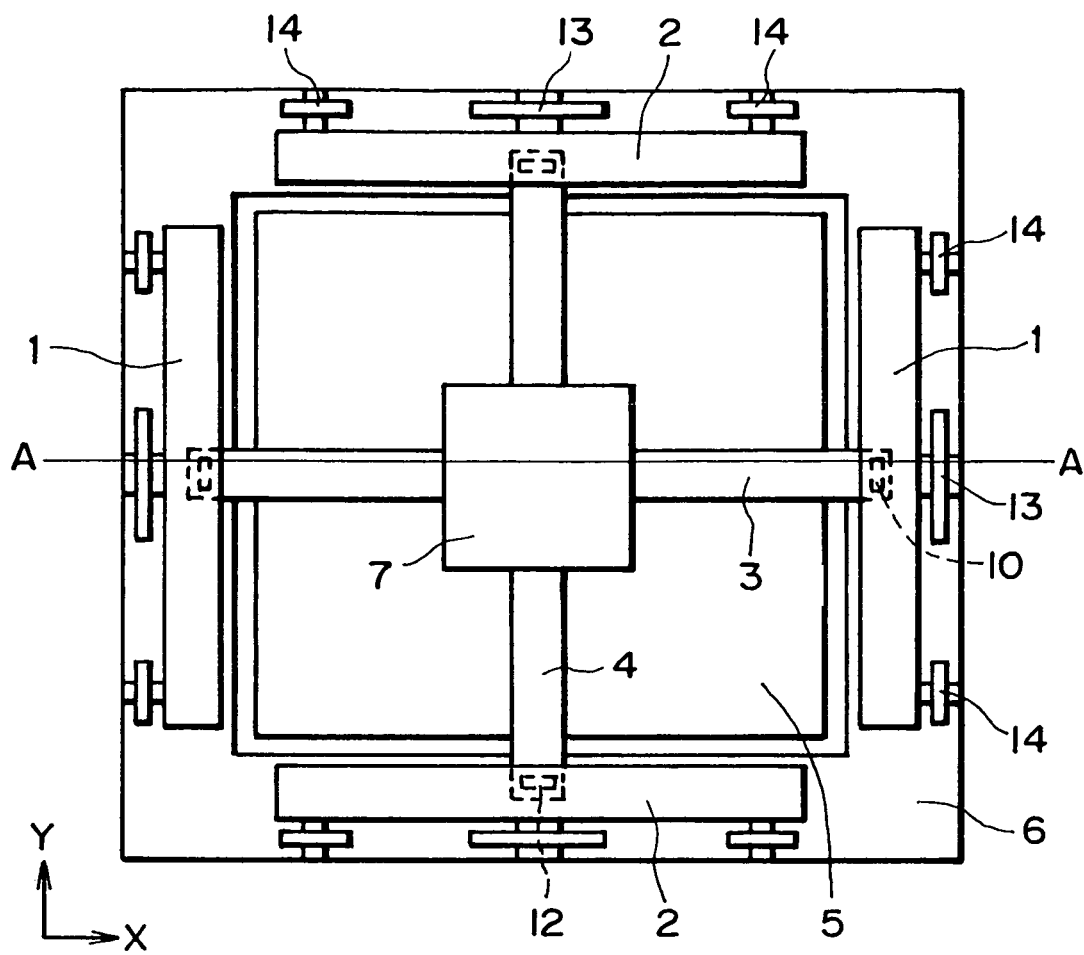
FIG. 1A is a schematic and plan view of a moving mechanism according to a first embodiment of the present invention.
Figure 1B:
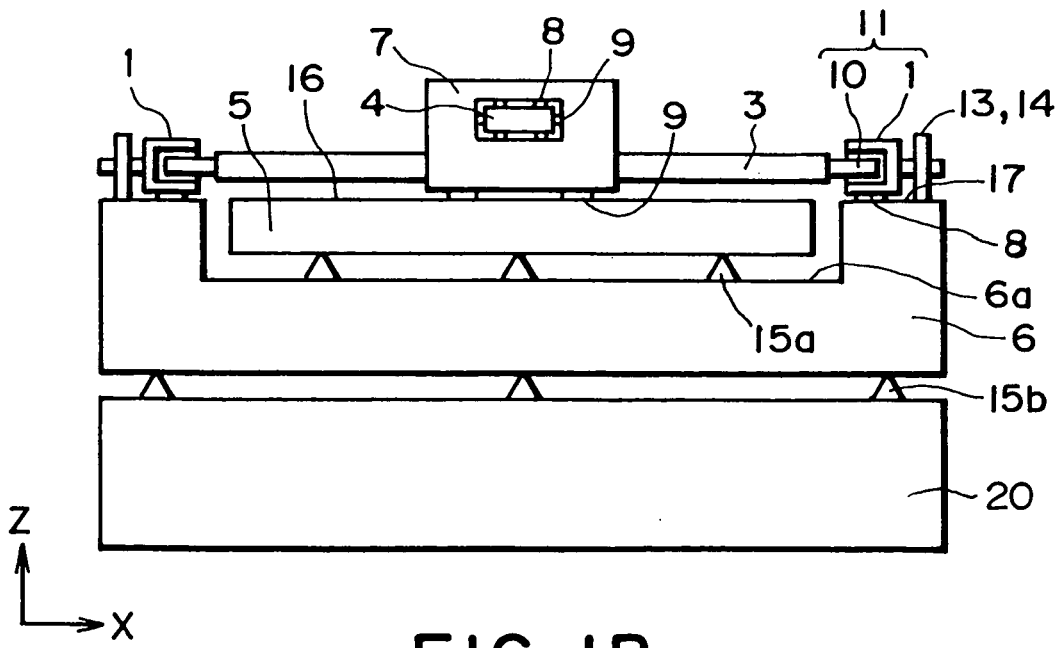
FIG. 1B is a sectional view of the moving mechanism, taken on line A-A in FIG. 1A.

FIG. 1A is a plan view of a moving mechanism according to a first embodiment of the present invention, and FIG. 1B is a sectional view of it. As shown in FIGS. 1A and 1B, the moving mechanism has an X guide bar 3, a Y guide bar 4, a structural member 5, a reference structural member 6, an X-Y slider 7, and so on.

The X guide bar 3 is movable in the Y direction and it functions to guide the motion of the X-Y slider in the X direction. The Y guide bar 4 is movable in the X direction, and it functions to guide the motion of the X-Y slider in the Y direction. In this embodiment, the X guide bar 3, the Y guide bar 4 and the X-Y slider 7 constitute a moving member.

The structural member 5 has a moving member guiding surface 16, as a first guide surface. The guide surface 16 guides the X-Y slider 7. The structural member 5 is supported at three points by anti-vibration tables 15a, and it is placed on a flat bottom face 6a inside a recessed portion of the reference structural member 6.

The reference structural member 6 is mounted on a base member 20 and it is supported by plural anti-vibration tables 15b. The reference structural member 6 has a stator guiding surface 17, as a second guide surface, at the top face around the recessed portion thereof. The second guide surface serves as a guide surface for the motion of the stator, to be described later. The structural member 5 and the reference structural member 6 are so arranged that the moving member guiding surface 16 and the stator guiding surface 17 are approximately coplanar with each other. The side face of the structural member 5 and the side face of the recessed portion of the reference structural member 6 are disposed opposed to each other with a clearance interposed therebetween.

The X-Y slider 7 is supported by static bearings 9 without contact to the guide surface 16 of the structural member 5. As a result, the X-Y slider 7 is movable in X and Y directions (along a plane). Disposed at opposite sides of the X guide bar 3 are electromagnetic actuators 11 for driving the X guide bar 3 in the Y direction.

The electromagnetic actuators 11X comprise a linear motor having a Y movable element 10 and a pair of Y stators 1. The Y movable elements 10 are disposed at the opposite ends of the X guide bard 3, which is slidably movable in the Y direction. The pair of Y stators 1 are disposed at right-hand and left-hand sides, independently of each other. Similarly, there are electromagnetic actuators 11Y, which comprise a linear motor having an X movable element 12 and a pair of X stators 2. The X moving elements 12 are disposed at the opposite ends of the Y guide bar 4, which is slidably movable in the X direction. The pair of X stators 2 are provided independently of each other. Here, the paired Y stators 1 and the paired X stators 2 are supported by static bearings 8 without contact to the guide surface 17 of the reference structural member 6, and they can be moved along the X-Y plane. The Y stators 1 and the X stators 2 have a predetermined mass, and they can serve as a mass member to be described later.

The X-Y slider 7 is guided by the X guide bar 3 and the Y guide bar 4 through the static bearings 9, and it can be moved along the X-Y plane. More specifically, the X-Y slider 7 moves in the Y direction along the Y guide bar 4 as the X guide bar 3 moves in the Y direction. When the Y guide bar 4 moves in the X direction, the X-Y slider moves in the X direction along the X guide bar 3.

The Y linear motor stator 1 receives a driving reaction force of a force, which acts when the X-Y slider 7 and the X slider 3 move in the Y direction. Also, the X linear motor stator 2 receives a driving reaction force of a force, which acts when the X-Y slider 7 and the Y slider 4 move in the X direction. Due to these driving reaction forces, the Y linear motor stator 1 and the X linear motor stator 2 shift along the guide surface 17, such that these stators function as a reaction force counter.

In this embodiment, when the X-Y slider 7 is driven in the +Y direction, for example, the left-hand and right-hand Y linear motor stators 1 receive a driving reaction force in the −Y direction, and they shift in the −Y direction. Similarly, when the X-Y slider 7 is driven in the +X direction, the upper and lower X linear motor stators 2, as viewed in FIG. 1A, receive a driving reaction force the −X direction, and they shift in the −X direction.

As the stator 1 or 2 moves, it causes deformation of the reference structural member 6 due to a displaced load. However, the structural member 5 is supported at three points by the anti-vibration tables 15a, and thus it is a dynamically separate member being isolated with respect to vibration. Therefore, the influence of deformation produced in the reference structural member 6 is not applied to the structural member 5 and, thus, the guide surface 16 of the X-Y slider 7 can be held in a plane.

The position of the X-Y slider 7 is measured by means of one or more interferometers (not shown). On the basis of the result of the position measurement performed by use of the interferometer or interferometers, the X-Y slider 7 is then positioned by means of a controller (not shown).

Denoted at 13 and 14 are linear motors for moving the stators 1 and 2 in the X or Y direction. The linear motors 13 and 14 are used for the positioning of the stators 1 and 2, and they can move the stators in the X , Y and θ direction. The linear motors 13 and 14 have a function for preventing the stators 1 and 2 from moving out of a predetermined displacement range. Further, the linear motors 13 and 14 have a function for correcting any positional error of the stator 1 or 2 to be produced by resistance or friction, when the stator 1 or 2 moves.

The positions of the stators 1 and 2 are measured by means of interferometers (not shown). On the basis of the result of position measurement using the interferometers, the stators 1 and 2 are then positioned by means of a controller (not shown) and through the driving motion of the linear motors 13 and 14.

In this embodiment, any deformation of the reference structural member 6 due to shift of the stators 1 and 2 does not adversely affect the structural member 5. Therefore, the guide surface 16 can be held in a plane, and high-precision positioning of the X-Y slider 7 can be maintained.

Further, in this embodiment, the reference structural member is mounted on anti-vibration tables 15b. This structure effectively suppresses swinging motion of the X-Y slider 7, constituting a stage, due to a reaction force that cannot be managed in conventional structures because a predetermined motion of a mass member is unattainable as a result of the influence of friction, and the like.

[Second Embodiment]

Figure 2:
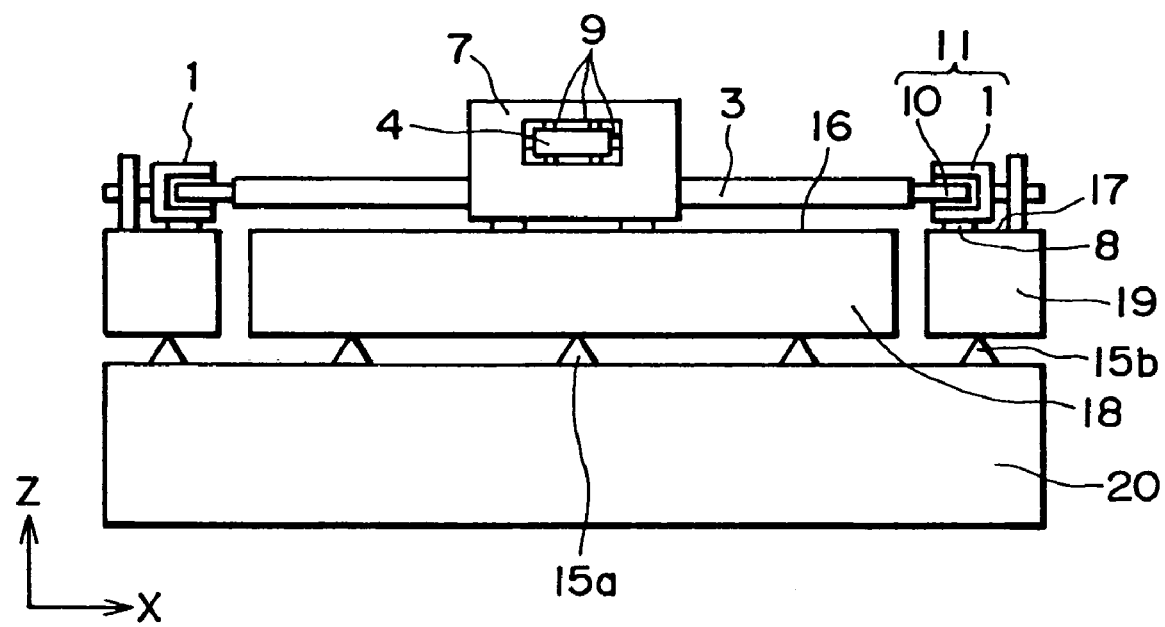
FIG. 2 is a sectional view of a moving mechanism according to a second embodiment of the present invention, being taken on line A-A in FIG. 1A.

FIG. 2 is a sectional view of a moving mechanism according to a second embodiment of the present invention. As shown in the drawing, the moving mechanism comprises a reference structural member 18 having a guide surface 16 for an X-Y slider 7, and a reference structural member 19 having a guide surface 17 for an X-Y linear motor stator, wherein these reference structural members are disposed out of contact to each other. In FIG. 2, the elements corresponding to those shown in FIG. 1 are denoted by like numerals. The structural member 18 is provided inside the structural member 19 having a rectangular frame-like shape, with a clearance being kept between it and the inner side wall of the structural member 19 and along the entire periphery thereof. These two structural members 18 and 19 are supported by plural anti-vibration tables 15a and 15b which are directly mounted on a base member 20 and which are provided separately from each other. Thus, any deformation of the reference structural member 19 due to a shifted load of the X-Y linear motor stator, following the reaction force management can be completely insulated, and it has no influence upon the reference structural member 18.

[Third Embodiment]

In a third embodiment, the present invention is applied to a stage and/or an exposure apparatus in which a moving mechanisms such as having been described with reference to the first embodiment or the second embodiment is incorporated as a stage. More specifically, in such a stage system, the X-Y slider 7 may be arranged to move while carrying an article thereon.

The exposure apparatus uses a reticle as an original having a pattern and a wafer as a substrate onto which the reticle pattern is to be transferred. The reticle and the wafer are articles to be moved, and the exposure apparatus comprises a stage system having a reticle stage for carrying a reticle thereof and a wafer stage for carrying a wafer thereon, each being provided by a moving mechanism of the present invention described hereinbefore. As a matter of course, the moving mechanism of the present invention may be used only in one of the reticle stage and the wafer stage.

It should be noted that the moving mechanism and the stage system according to the present invention can be applied not only to exposure apparatuses, but also to various high-precision machining or processing tools, for example.

[Embodiment of a Semiconductor Manufacturing System]

Next, an embodiment of a manufacturing system for semiconductor devices such as semiconductor chips (e.g., ICs or LSIs), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, a maintenance service such as software supply, can be made by use of a computer network outside the manufacturing factory.

Figure 3:
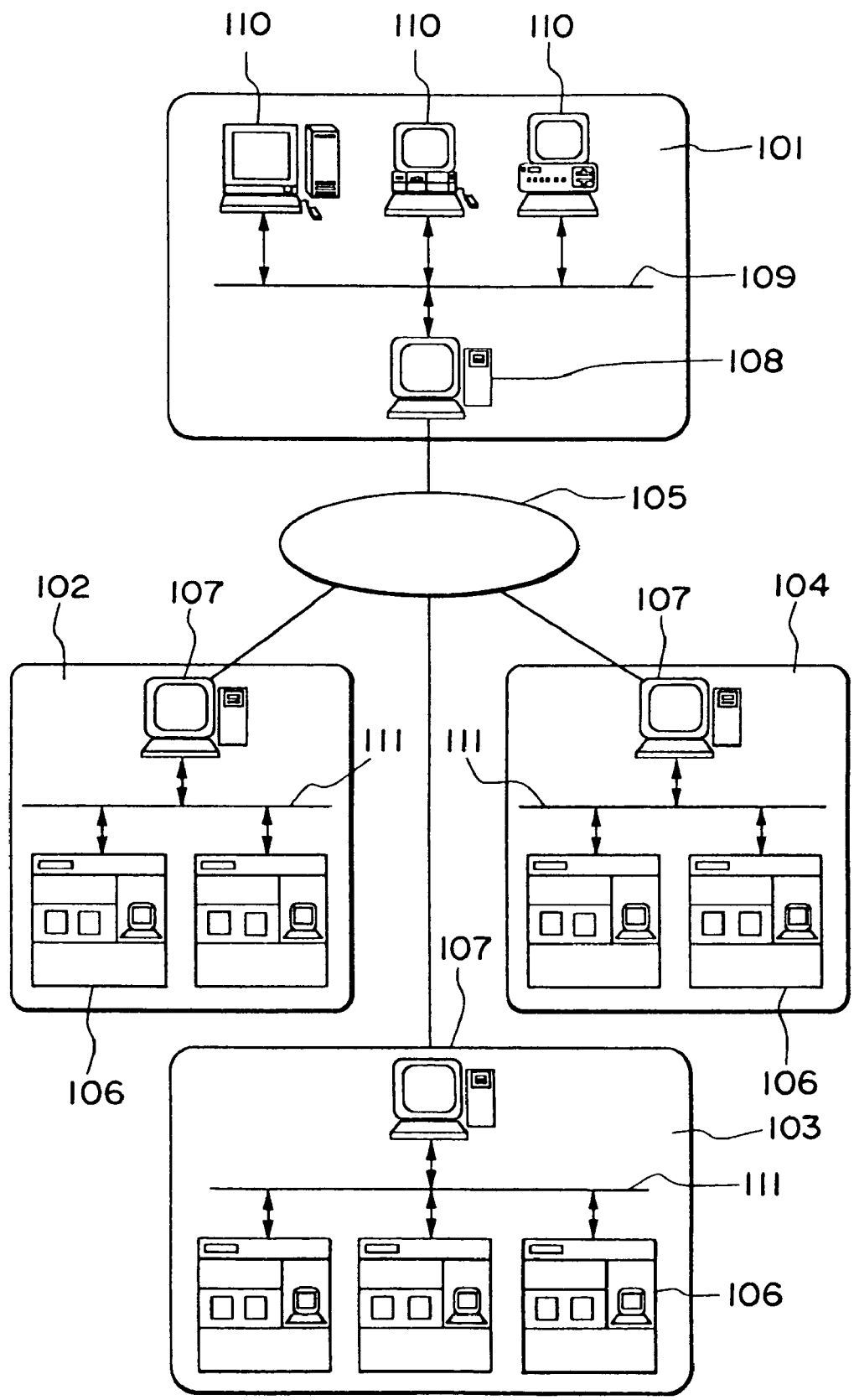
FIG. 3 is a schematic view of a semiconductor device manufacturing system, as viewed in a certain aspect thereof.

FIG. 3 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (e.g., various lithographic apparatuses such as an exposure apparatus, a resist coating apparatus, an etching apparatus, for example, as well as heat treatment apparatus, a film forming apparatus, and a flattening apparatus) and post-process machines (e.g., an assembling machine and an inspection machine, for example) are assumed. Inside the business office 101, there are a host control system 108 for providing a maintenance database for the production machines, plural operating terminal computers 110, and a local area network (LAN) 109 for connecting them to constitute an intranet. The host control system 108 is provided with a gateway for connecting the LAN 109 to an intranet 105, which is an outside network of the office, and a security function for restricting the access from the outside.

On the other hand, denoted at 102-104 are plural manufacturing factories of a semiconductor manufacturer or manufacturers as a user (users) of production machines. The factories 102-104 may be those which belong to different manufacturers or to the same manufacturer (e.g., they may be a pre-process factory and a post-process factory). In each of the factories 102-104, there are production machines 106, a local area network (LAN) 111 for connecting them to constitute an intranet, and a host control system 107 as a monitoring system for monitoring the state of operation of the production machines 106. The host control system 107 in each factory 102-104 is provided with a gateway for connecting the LAN 111 in the factory to the internet 105, which is an outside network of the factory. With this structure, the host control system 108 of the vendor 101 can be accessed from the LAN 111 in each factory, through the internet 105. Further, due to the security function of the host control system 108, only admitted users can access thereto. More specifically, through the internet 105, status information representing the state of operation of the production machines 106 (for example, the state of the machine in which any disorder has occurred) may be transmitted as a notice from the factory to the vendor. Additionally, any response information, which is responsive to the notice (that is, for example, information on how the disorder should be treated or software data concerning the treatment) as well as a latest software program and maintenance information such as help information, may be supplied from the vendor. The data communication between each factory 102-104 and the vendor 101, as well as the data communication through the LAN 111 in each factory, may use a communication protocol (TCP/IP) generally-used in the Internet. In place of using the Internet, an exclusive line network (e.g., an ISDN) controlled with a strictest security that access of a third party is not allowed, may be used. Further, the host control system is not limited to the system as provided by the vendor. A database may be structured by the user and it may be set in an outside network, such that it can be accessed from plural user factories.

Figure 4:
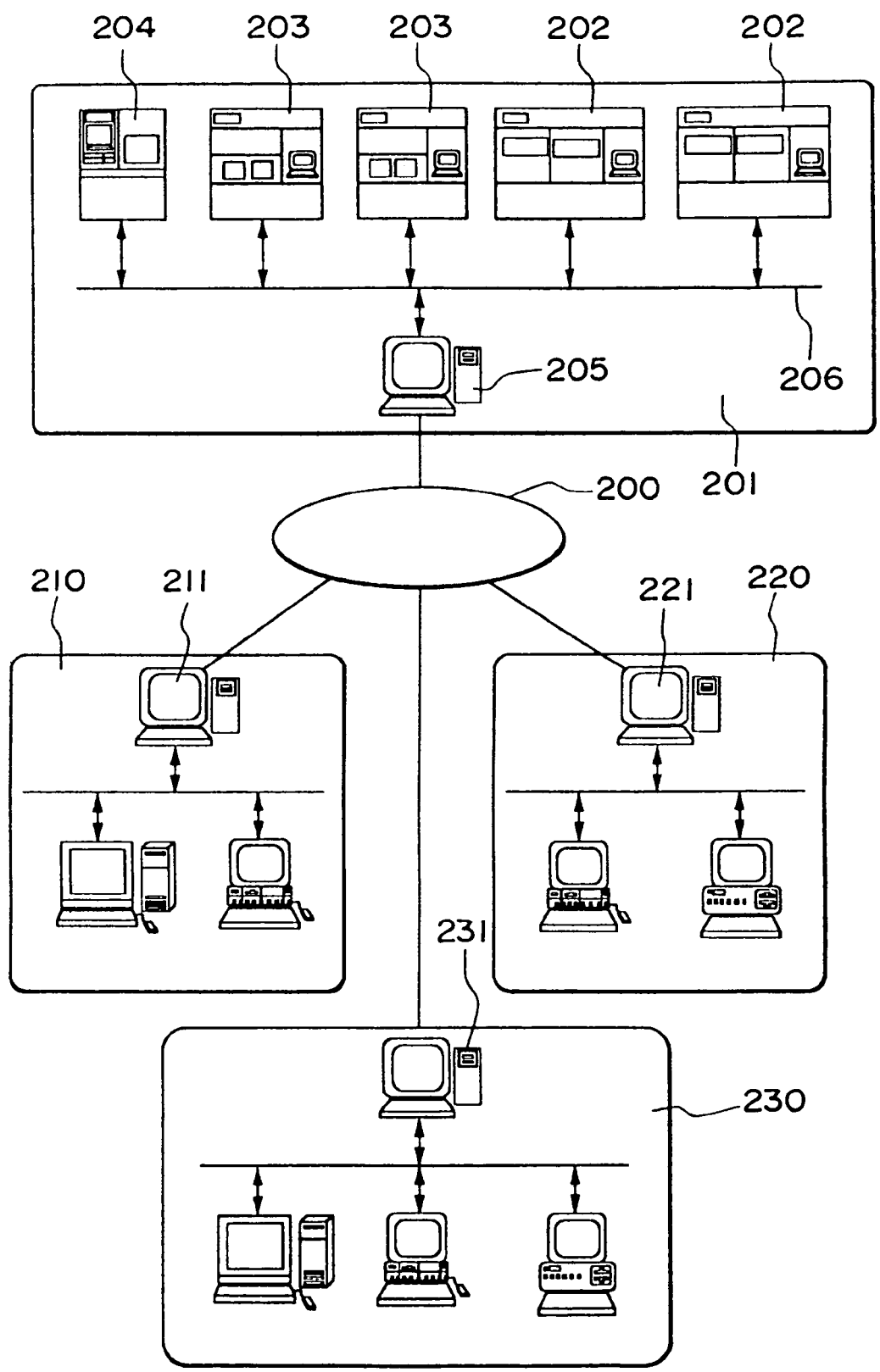
FIG. 4 is a schematic view of a semiconductor device manufacturing system, as viewed in another aspect thereof.

FIG. 4 is a schematic view of a general structure of the production system according to this embodiment, in another aspect thereof different from that of FIG. 3. In the preceding example, a plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 202, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 231 for performing remote control maintenance for the machine they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (Internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or wide-use web browser, and a user screen interface such as shown in FIG. 5, for example, may be provided on the display. Various data may be inputted into the computer (input zones on the screen) by an operator who controls the production machines in each factory, such as for example, machine type (401), serial number (402), trouble file name (403), date of disorder (404), emergency level (405), status (406), solution or treatment (407), and progress (408). The thus inputted information is transmitted to the maintenance database through the Internet. In response, appropriate maintenance information is replied from the maintenance database to the user's display. Further, the user interface as provided by the web browser enables a hyperlink function (410-412) as illustrated. As a result, the operator can access further details of information in each of the items, he/she can get the latest version software to be used for the production machine, from the software library as provided by the vendor. Alternatively, the operator can get an operation guide (help information) prepared for factory operators.

Next, a semiconductor device manufacturing process, which uses the production system described above, will be explained.

Figure 6:
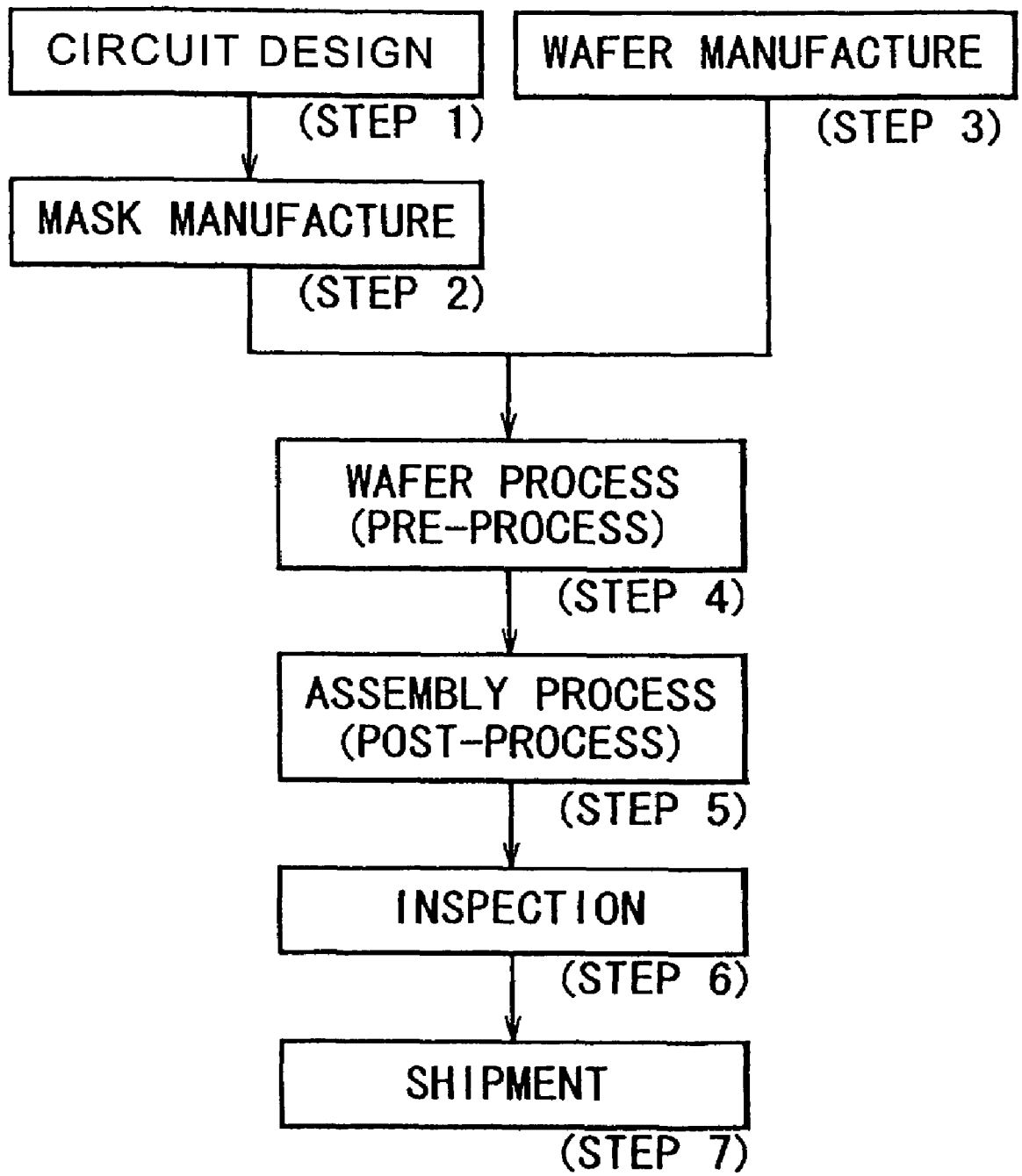
FIG. 6 is a flow chart for explaining device manufacturing processes.

FIG. 6 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5, subsequent to this, is an assembling step (called a post-process), wherein the wafer having been processed by step 4 is formed into semiconductor chips. This step includes an assembling (dicing and bonding) process and a packaging (chip sealing) process. Step 6 is an inspection step wherein an operation check, a durability check, and so on, for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the Internet or an exclusive line network.

Figure 7:
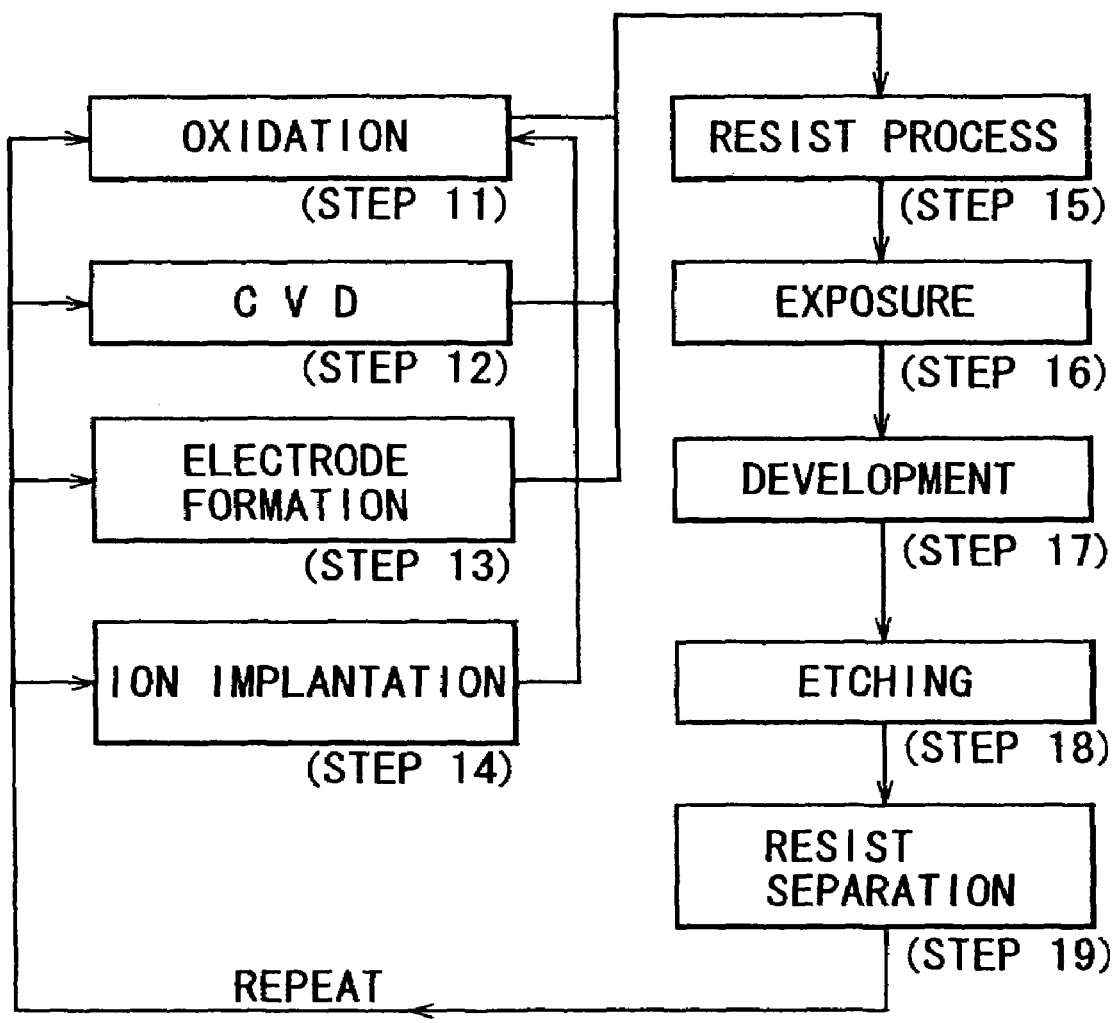
FIG. 7 is a flow chart for explaining details of a wafer process.

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these process, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

In a moving mechanism and a stage system according to the present invention, a reaction force produced by acceleration/deceleration as a moving member moves is received by a stator. When the stator as a reaction force is applied thereto shifts, since the guide surfaces of the moving member and the stator are independent from each other, any deformation of the stator guide surface resulting from a shifted load of the stator does not apply any adverse influence to the guide surface of the moving element.

In an exposure apparatus according to the present invention as having a stage such as described above, adverse influences to be caused by vibration produced by motion of the stage or by deformation of a guide surface resulting from displacement of a stator can be blocked satisfactorily. As a result, performances such as overlay precision, linewidth precision, throughput, and the like, can be improved significantly. Further, since an unbalanced load as the moving member moves can be made small, particularly, the overlay precision can be improved. On the other hand, since the influence of the reaction force caused by state acceleration/deceleration to the floor can be made small, adverse influence to any other equipment mounted on the same floor can also be made small. Additionally, an unwanted increase of the occupation area on the floor can be prevented.

While the invention has been described with reference to the structures disclosed herein, it is not confined to the details set forth and this application is intended to cover such modifications or changes as may come within the purpose of the improvements or the scope of the following claims.

What is claimed is:

1. A moving mechanism comprising:
   a first structural member having a first guide surface;
   a moving member being movable along said first guide surface;
   a second structural member having a second guide surface; and
   an actuator having a movable element provided on said moving member and a stator being movable along said second guide surface; and
   a supporting member configured to support said first structural member at three points, through said second structural member.

2. A moving mechanism according to claim 1, wherein said stator moves to cancel a reaction force produced when said moving member is driven.

3. A moving mechanism according to claim 1, wherein said moving mechanism as a whole is mounted on an anti-vibration table.

4. A moving mechanism according to claim 1, further comprising a second actuator configured to move said stator.

5. A moving mechanism according to claim 1, wherein said actuator comprises a linear motor which includes said moving element and said stator.

6. An exposure apparatus for processing a substrate, said apparatus comprising:
   a moving mechanism as recited in claim 1, wherein said moving mechanism is arranged to position the substrate so that a pattern is transferred onto the substrate.

7. A device manufacturing method, comprising the steps of:
   processing a wafer by use of an exposure apparatus as recited in claim 6 and
   assembling the wafer processed in said processing step into a device.

8. A stage system for positioning a substrate, said stage system comprising:
   a movable member being movable while carrying the substrate thereon;
   a first structural member for guiding said movable member;
   an actuator for moving said movable member and having a movable element and a stator;
   a second structural member for supporting said stator, the stator of said actuator being movable on said second structural member; and
   a supporting member configured to support said first structural member at three points, through said structural member.

9. An exposure apparatus for processing a substrate, said apparatus comprising:
   a stage system as recited in claim 8, wherein said stage system is arranged to position the substrate so that a pattern is transferred onto the substrate.

10. A device manufacturing method, comprising the steps of:
    processing a wafer by use of an exposure apparatus as recited in claim 9 and
    assembling the wafer processed in said processing step into a device.

* * * * *